United States Patent [19]
Reinberg

[11] Patent Number: 5,920,788
[45] Date of Patent: Jul. 6, 1999

[54] CHALCOGENIDE MEMORY CELL WITH A PLURALITY OF CHALCOGENIDE ELECTRODES

[75] Inventor: Alan R. Reinberg, Westport, Conn.

[73] Assignee: Micron Technology, Inc., Boise, Id.

[21] Appl. No.: 08/991,296

[22] Filed: Dec. 16, 1997

Related U.S. Application Data

[62] Division of application No. 08/486,375, Jun. 7, 1995, Pat. No. 5,789,758.

[51] Int. Cl.[6] .......................... H01L 47/00; H01L 27/26; H01L 21/62
[52] U.S. Cl. ..................... 438/466; 438/900; 438/675; 365/163; 257/2
[58] Field of Search .................... 257/2–5; 438/466, 438/102, 103, 95, 675, 900; 365/163

[56] References Cited

U.S. PATENT DOCUMENTS

| | | | |
|---|---|---|---|
| 3,423,646 | 1/1969 | Cubert et al. | 317/234 |
| 3,796,926 | 3/1974 | Cole et al. | 317/234 R |
| 4,099,260 | 7/1978 | Lynes et al. | 365/105 |
| 4,115,872 | 9/1978 | Bluhm | 257/2 |
| 4,174,521 | 11/1979 | Neale | 357/45 |
| 4,194,283 | 3/1980 | Hoffmann | 29/571 |
| 4,203,123 | 5/1980 | Shanks | 357/2 |
| 4,227,297 | 10/1980 | Angerstein | 29/571 |
| 4,272,562 | 6/1981 | Wood | 427/87 |
| 4,458,260 | 7/1984 | McIntyre et al. | 357/30 |
| 4,499,557 | 2/1985 | Holmberg et al. | 365/163 |
| 4,502,208 | 3/1985 | McPherson | 29/584 |
| 4,569,698 | 2/1986 | Feist | 148/1.5 |
| 4,666,252 | 5/1987 | Yaniv et al. | 350/333 |
| 4,677,742 | 7/1987 | Johnson | 29/591 |
| 4,757,359 | 7/1988 | Chiao et al. | 357/23.5 |
| 4,804,490 | 2/1989 | Pryor et al. | 252/62.3 BT |
| 4,809,044 | 2/1989 | Pryor et al. | 357/2 |
| 4,823,181 | 4/1989 | Mohsen et al. | 357/51 |
| 4,876,220 | 10/1989 | Mohsen et al. | 437/170 |
| 4,876,668 | 10/1989 | Thakoor et al. | 365/163 |
| 4,881,114 | 11/1989 | Mohsen et al. | 357/54 |
| 4,892,840 | 1/1990 | Esquivel et al. | 437/52 |
| 5,144,404 | 9/1992 | Iranmanesh et al. | 357/51 |
| 5,166,096 | 11/1992 | Cote et al. | 437/195 |
| 5,166,758 | 11/1992 | Ovshinsky et al. | 257/3 |
| 5,177,567 | 1/1993 | Klersy et al. | 257/4 |
| 5,296,716 | 3/1994 | Ovshinsky et al. | 257/3 |
| 5,335,219 | 8/1994 | Ovshinsky et al. | 369/288 |
| 5,341,328 | 8/1994 | Ovshinsky et al. | 365/163 |
| 5,359,205 | 10/1994 | Ovshinsky | 257/3 |
| 5,363,329 | 11/1994 | Troyan | 365/184 |
| 5,510,629 | 4/1996 | Karpovich et al. | 257/50 |
| 5,534,711 | 7/1996 | Ovshinsky et al. | 257/3 |

FOREIGN PATENT DOCUMENTS

| | | | |
|---|---|---|---|
| 0 117 045 | 8/1984 | European Pat. Off. | H01L 45/00 |
| 60-109266 | 6/1985 | Japan | H01L 27/10 |
| 1 319 388 | 6/1973 | United Kingdom | H01L 9/00 |

OTHER PUBLICATIONS

Kim and Kim, "Effects of High–Current Pulses on Polycrystalline Silicon Diode with n–type Region Heavily Doped with Both Boron and Phosphorus," *J. Appl. Phys.*, 53(7):5359–5360, 1982.

Neale and Aseltine, "The Application of Amorphous Materials to Computer Memories," *IEEE*, 20(2):195–205, 1973.

Pein and Plummer, "Performance of the 3–D Sidewall Flash EPROM Cell," *IEEE*, 11–14, 1993.

(List continued on next page.)

*Primary Examiner*—John Guay
*Attorney, Agent, or Firm*—Fletcher, Yoder & Van Someren

[57] ABSTRACT

A chalcogenide memory cell with chalcogenide electrodes positioned on both sides of the active chalcogenide region of the memory cell. The chalcogenide memory cell includes upper and lower chalcogenide electrodes with a dielectric layer positioned therebetween. The dielectric layer includes an opening defining a pore. A volume of chalcogenide material formed integral to the upper chalcogenide electrode is contained within the pore. The upper and lower chalcogenide electrodes both have greater cross sectional areas than the pore.

25 Claims, 4 Drawing Sheets

OTHER PUBLICATIONS

Post and Ashburn, "Investigation of Boron Diffusion in Polysilicon and its Application to the Design of p–n–p Polysilicon Emitter Bipolar Transistors with Shallow Emitter Junctions," *IEEE*, 38(11):2442–2451, 1991.

Post et al., "Polysilicon Emitters for Bipolar Transistors: A Review and Re–Evaluation of Theory and Experiment," *IEEE*, 39(7):1717–1731, 1992.

Post and Ashburn, "The Use of an Interface Anneal to Control the Base Current and Emitter Resistance of p–n–p Polysilicon Emitter Bipolar Transistors," *IEEE*, 13(8):408–410, 1992.

Rose et al., "Amorphous Silicon Analogue Memory Devices," *J. Non–Crystalline Solids*, 115:168–170, 1989.

Schaber et al., "Laser Annealing Study of the Grain Size Effect in Polycrystalline Silicon Schottky Diodes," *J. Appl. Phys.*, 53(12):8827–8834, 1982.

Yamamoto et al., "The I–V Characteristics of Polycrystalline Silicon Diodes and the Energy Distribution of Traps in Grain Boundaries," *Electronics and Communications in Japan*, Part 2, 75(7):51–58, 1992.

Yeh et al., "Investigation of Thermal Coefficient for Polycrystalline Silicon Thermal Sensor Diode," *Jpn. J. Appl. Phys.*, 31(Part 1, No. 2A):151–155, 1992.

Oakley et al., "Pillars—The Way to Two Micron Pitch Multilevel Metallisation," *IEEE*, 23–29, 1984.

FIG. 1
(PRIOR ART)
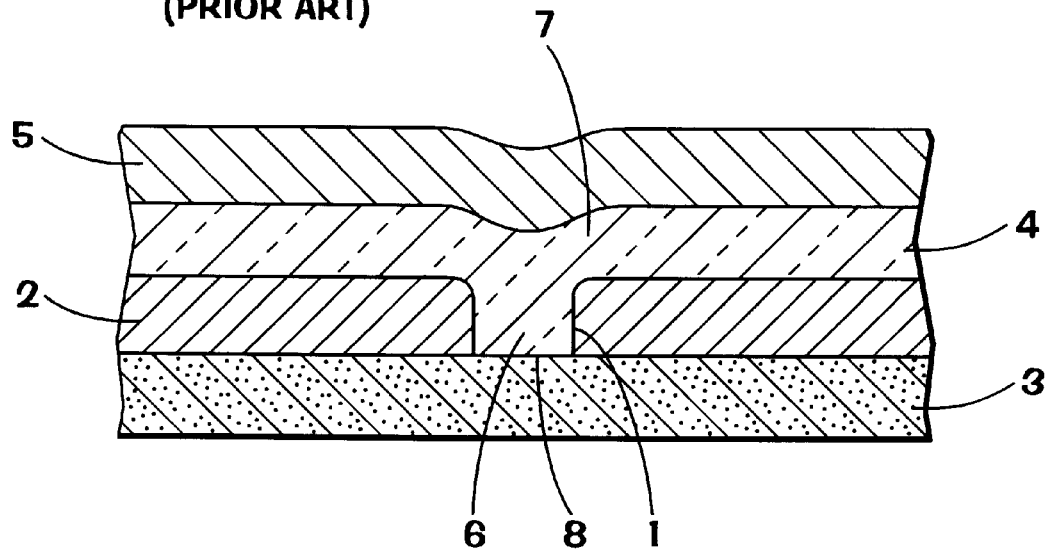
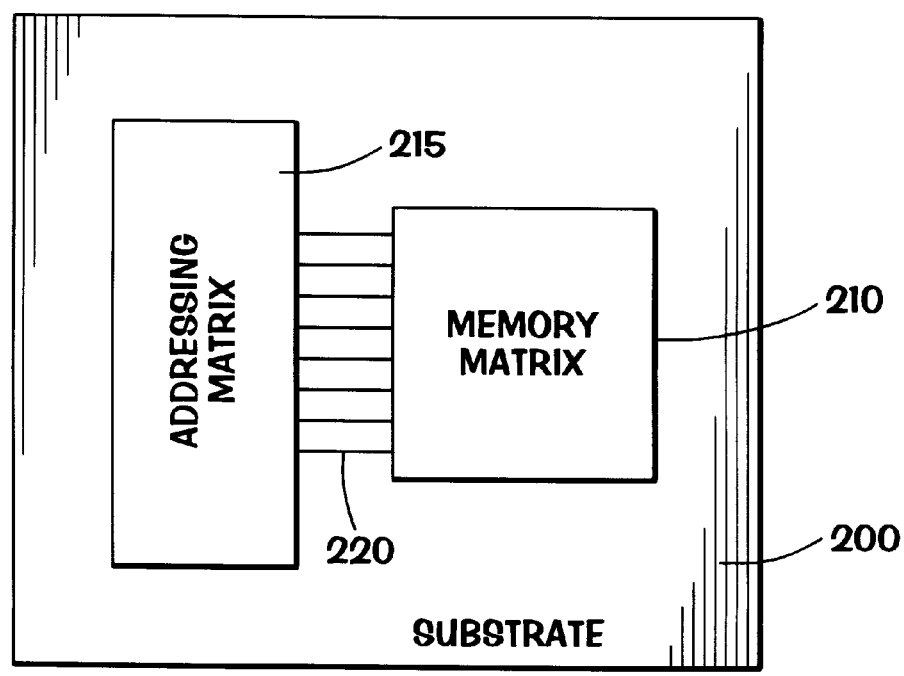
FIG. 6

CHALCOGENIDE MEMORY CELL WITH A PLURALITY OF CHALCOGENIDE ELECTRODES

This application is a Divisional of application Ser. No. 08/486,375 filed Jun. 7, 1995, now U.S. Pat. No. 5,789,758.

BACKGROUND OF THE INVENTION

The present invention relates generally to phase or state changeable memory devices and, more particularly, to chalcogenide memory cells.

The use of electrically writable and erasable phase change materials (i.e., materials which can be electrically switched between generally amorphous and generally crystalline states or between different resistive states while in crystalline form) for electronic memory applications is well known in the art and is disclosed, for example, in U.S. Pat. No. 5,296,716 to Ovshinsky et al., the disclosure of which is incorporated herein by reference. U.S. Pat. No. 5,296,716 is believed to generally indicate the state of the art, and to contain a discussion of the current theory of operation of chalcogenide materials.

Generally, as disclosed in the aforementioned Ovshinsky patent, such phase change materials can be electrically switched between a first structural state where the material is generally amorphous and a second structural state where the material has a generally crystalline local order. The material may also be electrically switched between different detectable states of local order across the entire spectrum between the completely amorphous and the completely crystalline states. That is, the switching of such materials is not required to take place between completely amorphous and completely crystalline states but rather the material can be switched in incremental steps reflecting changes of local order to provide a "gray scale" represented by a multiplicity of conditions of local order spanning the spectrum from the completely amorphous state to the completely crystalline state.

The material exhibits different electrical characteristics depending upon its state. For instance, in its amorphous state the material exhibits a lower electrical conductivity than it does in its crystalline state.

These memory cells are monolithic, homogeneous, and formed of chalcogenide material selected from the group of Te, Se, Sb, and Ge. Such chalcogenide materials can be switched between numerous electrically detectable conditions of varying resistivity in nanosecond time periods with the input of picojoules of energy. The resulting memory material is truly non-volatile and will maintain the integrity of the information stored by the memory cell without the need for periodic refresh signals. The subject memory material is directly overwritable so that the memory cells need not be erased (set to a specified starting point) in order to change information stored within the memory cells. Finally, the large dynamic range offered by the memory material provides for the gray scale storage of multiple bits of binary information in a single cell by mimicking the binary encoded information in analog form and thereby storing multiple bits of binary encoded information as a single resistance value in a single cell.

The operation of chalcogenide memory cells requires that a region of the chalcogenide memory material, called the chalcogenide active region, be subjected to a current pulse typically with a current density between about $10^5$ and $10^6$ amperes/cm$^2$. This current density may be accomplished by creating a small opening 1, referred to as a pore, in a dielectric material 2 which is itself deposited onto a lower electrode material 3 as illustrated in FIG. 1. The chalcogenide material 4 is then deposited over the dielectric material 2 and into the pore 1 into contact with the lower electrode material 3. A top electrode material 5 is then deposited over the chalcogenide material 4. Carbon is a commonly used electrode material although other materials have also been used, for example, molybdenum and titanium nitride. The chalcogenide active region 6 is primarily defined by the volume of chalcogenide material 4 that is contained within the pore 1 defined by the opening in the dielectric material 2. The upper portion 7 of the chalcogenide material 4 not contained within the pore 1 acts as an electrode that in turn contacts with the upper electrode material 5. The chalcogenide active region 6 makes contact with the lower electrode 3 at an interface area 8 that is substantially equal to the cross sectional area of the pore 1.

As a consequence of this configuration, the interface area of the chalcogenide material within the chalcogenide active region is subjected to the high current density required for operation of the chalcogenide memory cell. This is an undesirable situation as the high current density at the interface area of the chalcogenide active region with the lower electrode causes mixing of the lower electrode material with the chalcogenide material of the chalcogenide active region due to heating and electrophoretic effects. The mixing of the electrode material with the chalcogenide material of the chalcogenide active region results in instability of the chalcogenide memory cell in operation.

The present invention is directed to overcoming, or at least reducing the affects of, one or more of the problems set forth above. In particular, the present invention provides a multilevel chalcogenide memory cell with relatively large area chalcogenide electrodes on both sides of the active region of the chalcogenide memory cell thereby reducing the current density at the interface area between the top and bottom electrodes and the chalcogenide material. As a result, the current density and associated heating and electrophoretic effects are minimized.

SUMMARY OF THE INVENTION

In accordance with one aspect of the present invention there is provided a chalcogenide memory cell with chalcogenide electrodes on both sides of the chalcogenide active region of the memory cell. The cross sectional areas of each of the chalcogenide electrodes are greater than the cross sectional area of the chalcogenide active region of the memory cell positioned within a pore defined by an aperture in a dielectric layer.

In accordance with another aspect of the present invention there is provided an array of individually addressable chalcogenide memory cells with chalcogenide electrodes positioned above and below the chalcogenide active regions of the memory cells.

BRIEF DESCRIPTION OF THE DRAWINGS

The present invention will become more fully understood from the following detailed description of the preferred embodiments, taken in conjunction with the accompanying drawings in which:

FIG. 1 is a fragmentary cross sectional view illustrating a portion of a conventional chalcogenide memory cell;

FIG. 6 is a diagrammatical illustration illustrating a portion of a single crystal semiconductor substrate with the integrated memory and addressing matrixes depicted in FIGS. 2 and 3.

DETAILED DESCRIPTION OF PREFERRED EMBODIMENTS

The present preferred embodiments provide chalcogenide memory cells with chalcogenide electrodes positioned immediately above and below the chalcogenide active region of the memory cells. Non-chalcogenide electrodes are then positioned above and below the chalcogenide electrodes. In this manner, the current density at the interface between the top and bottom non-chalcogenide electrodes and the top and bottom chalcogenide electrodes is reduced. As a result, the current density and associated heating and electrophoretic effects are minimized thereby preventing instability of the chalcogenide active region in operation.

Figure 2:
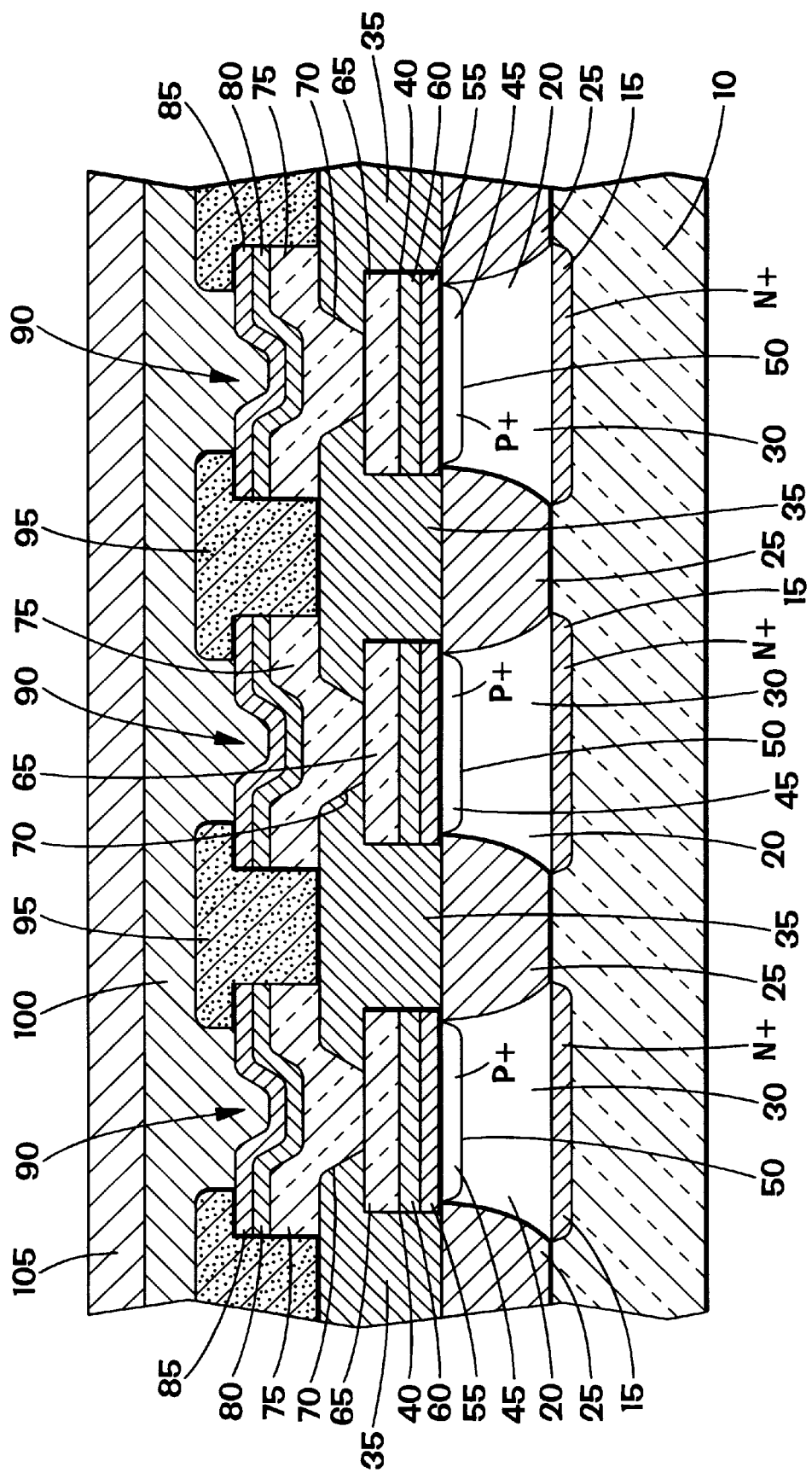
FIG. 2 is a fragmentary cross sectional view illustrating a portion of an integrated circuit electrically erasable and directly overwritable multibit memory configuration of a first preferred embodiment of the present invention.

Turning now to the drawings and referring initially to FIG. 2, there is shown a cross sectional view of a portion of the structure of an electrically erasable memory. The memory structure is formed on a single crystal silicon semiconductor wafer 10 which is p-doped and which forms a p-substrate for the deposition of the remaining elements of the configuration illustrated.

Formed in the p-substrate 10 are n+ channels 15, which may be formed by diffusion in a manner well known in the art. These n+ channels 15 extend across the chip in a direction perpendicular to the plane of the illustration and form one set of conductive access lines, in this case the y set, of an x-y grid for addressing the individual memory cells.

An n-doped crystalline epitaxial layer 20 is formed on top of this n+ grid structure by techniques well known in the art. The n-doped epitaxial layer 20 may be about 5,000 Angstroms thick, for example. Using known masking and doping techniques, p-doped isolation channels 25 are then formed in the n-epitaxial layer 20. These p-doped isolation channels 25 extend all the way down to the p-substrate 10 as shown in FIG. 2 and also extend completely around and isolate and define islands 30 of the n-epitaxial layer 20. The islands 30 are shown more clearly in the top view of FIG. 4 wherein the p-doped isolation channels 25 are shown as forming an isolation grid defining and isolating the islands 30 of the n-doped epitaxial material 20. Instead of the p-doped isolation channels 25, $SiO_2$ isolation trenches may be used for isolation of the islands 30. The technique of formation of such $SiO_2$ isolation trenches is well known to those skilled in the art.

A layer 35 of thermally grown $SiO_2$ is then partially formed on the structure just described and etched out to form apertures 40 over the islands 30. Diffusion regions 45 of p+ material are then formed within the areas defined by the apertures 40 as shown in FIG. 2. The semiconductor junctions of the p+ regions and the n epitaxial layer form p-n junction diodes 50 in series with each of the regions of the n epitaxial layer exposed through the apertures 40 of the partially formed $SiO_2$ layer 35.

The bottom electrode contact layers 55, 60, and 65 are then deposited using well known deposition techniques within the apertures 40 of the $SiO_2$ layer 35. The electrode contact layer 55 may be comprised of titanium nitride or tungsten silicide, and it is preferably comprised of molybdenum. The electrode contact layer 60 may or may not be present, but when present it is preferably comprised of carbon. The electrode contact layer 65 is comprised of a chalcogenide material layer. This chalcogenide layer will typically be deposited by sputtering.

The remainder of the layer 35 of thermally grown $SiO_2$ is then formed on the structure just described and etched out in a well known manner to form apertures 70 over the chalcogenide electrode layer 65. The apertures 70 provide the pores that define and partially contain the active chalcogenide region of the memory cells of the present preferred embodiment. The apertures 70 may be formed by alternative and known methods, such as, for example, a current pulse or by photolithographic methods.

Another chalcogenide layer 75 is then deposited over the layer 35 of thermally grown $SiO_2$ and into the pore defined by the aperture 70. The volume of the chalcogenide layer 75 within the pore defined by the aperture 70 forms a portion of the active region of the chalcogenide material of the memory cell, and the diameter, or minimum lateral dimension, of the aperture 70 determines the active region within each chalcogenide layer 75. Preferably the interface between the lower chalcogenide contact electrode 65 and the chalcogenide layer 75 is cleaned, using conventional methods, prior to deposition of the chalcogenide layer 75. The upper region of the chalcogenide layer 75 not contained within the pore defined by the aperture 70 provides an upper chalcogenide contact electrode. The remaining upper contact electrode layers of carbon 80 and molybdenum 85 are then deposited in a well known manner.

The combination of the lower contact electrode layers of carbon 55, molybdenum 60, chalcogenide 65, the chalcogenide layer 75 (including the active chalcogenide region within the pore defined by the apertures 70 and the upper region providing an upper chalcogenide contact electrode), and the upper contact electrode layers of carbon 80 and molybdenum 85 form the individual memory cells 90. The resulting structure provides chalcogenide electrodes above and below the active chalcogenide region of the memory cell 90 having cross sectional areas greater than that of the active chalcogenide region defined by the aperture 70. As a result of this configuration, the current density and associated heating and electrophoretic effects upon the active region are minimized, thereby preventing the introduction of foreign material into the active chalcogenide area of the memory cell 90. At the same time, the active region of the chalcogenide layer 75 may still be controlled through control of the minimum lateral dimension, or diameter, of the aperture 70. In one currently preferred embodiment, the average cross sectional areas of the upper and lower chalcogenide electrodes are approximately two to ten times that of the average cross sectional area of the chalcogenide region within the pore defined by the aperture 70. As shown in FIG. 2, the memory cells 90 are deposited over the p+ regions 45 in individual ohmic electrical series contact with the diodes 50.

Typical chalcogenide compositions for these memory cells 90 include average concentrations of Te in the amorphous state well below 70%, typically below about 60% and ranging in general from as low as about 23% up to about 56% Te and most preferably to about 48% to 56% Te. Concentrations of Ge are typically above about 15% and range from a low of about 17% to about 44% average in the high resistance state, remaining generally below 50% Ge, with the remainder of the principal constituent elements in this class being Sb. The percentages given are atomic percentages which total 100% of the atoms of the constituent elements. This class of materials are typically characterized as $Te_aGe_bSb_{100-(a+b)}$, where a is equal to or less than about 70% and preferably between about 60% to about 40%, b is above about 15% and less than 50%, preferably between about 17% to about 44% and the remainder is Sb.

The contact layers 55, 60, 80 and 85 of carbon and molybdenum form excellent electrical contacts with the chalcogenide layers 65 and 75 and also form diffusion barriers which effectively block diffusion of elements into and out of the chalcogenide layers 65 and 70. The carbon layers, 60 and 80, have a relatively high electrical resistivity and are more difficult to etch and are, therefore, preferably relatively thin, typically in the range of approximately 100 to 1,000 Angstroms. The molybdenum layers 55 and 85 should be thicker, preferably in the range of about 1,000 to 2,000 Angstroms, in order to act as effective diffusion barriers for the chalcogenide layers 65 and 75.

The chalcogenide layers 65 and 75 are each formed of a multi-element material, such as the chalcogenide materials disclosed herein. The layers are preferably sputter deposited in the high resistance state, but may be formed in other ways such as by evaporation or by chemical vapor deposition, which may be enhanced by plasma techniques such as RF glow discharge. The chalcogenide electrode contact layer 65 may typically range in thickness from about 100 Angstroms to about 1000 Angstroms, and preferably it is about 300 to 800 Angstroms and most preferably it is about 400 to 600 Angstroms in thickness. The upper chalcogenide layer 75 may typically range in thickness from about 100 Angstroms to about 1000 Angstroms, and preferably it is about 300 to 800 Angstroms and most preferably it is about 400 to 600 Angstroms in thickness. The lateral dimension or diameter of the pore of the chalcogenide active region defined by the aperture 70 may be in the range of less than about 0.5 to 1 micrometers or so, although there is no practical limit on the lateral dimension. The pore diameter can be as small as lithography resolution limits will permit.

In a preferred embodiment of the present invention, the pore diameter is selected such that it conforms substantially with the diameter of the low resistance path which is formed when the material is switched to the low resistance state. The diameter of the pore of the memory cell 90 is therefore preferably less than about one micrometer so that the volume of the chalcogenide material within the chalcogenide active region is limited as much as is feasible to the volume of the chalcogenide material which is actually switched back and forth between the high and low resistance states. This further reduces the switching time and the electrical energy required to initiate the detectable change in resistance.

It is further preferred that the pore regions of the memory cells 90 be thermally isolated and/or controlled except only for the required electrical contacts with the upper and lower contacts as necessary for proper operation of the memory cells 90. This further confines, limits and controls the heat transfer from the switched volume of the pore the electrical energy required for the resistance transitions. This is accomplished in the embodiments of FIGS. 2 and 3 by the oxide layers 35 and 95 which surround the lateral peripheral portions of the memory cells 90.

The layers 75, 80, and 85 are etched, and the oxide layer 95 is formed thereover and etched to leave openings above the memory cells 90 as shown. Deposited on top of the entire structure just described is the second electrode grid structure formed of aluminum conductors 100 which extend perpendicular in direction to the conductors 15 and complete the x-y grid connection to the individual memory cells 90. Overlaying the complete integrated structure is a top encapsulating layer 105 of a suitable encapsulant, such as silicon nitride, or a plastic material, such as polyimide, which seals the structure against moisture and other external elements which could cause deterioration and degradation of performance, particularly of the phase change materials in the memory cells 90. The silicon nitride encapsulant can be deposited, for example, using a low temperature plasma deposition process. The polyimide material can be spin deposited and baked after deposition in accordance with known techniques to form the encapsulant layer 105.

Figure 3:
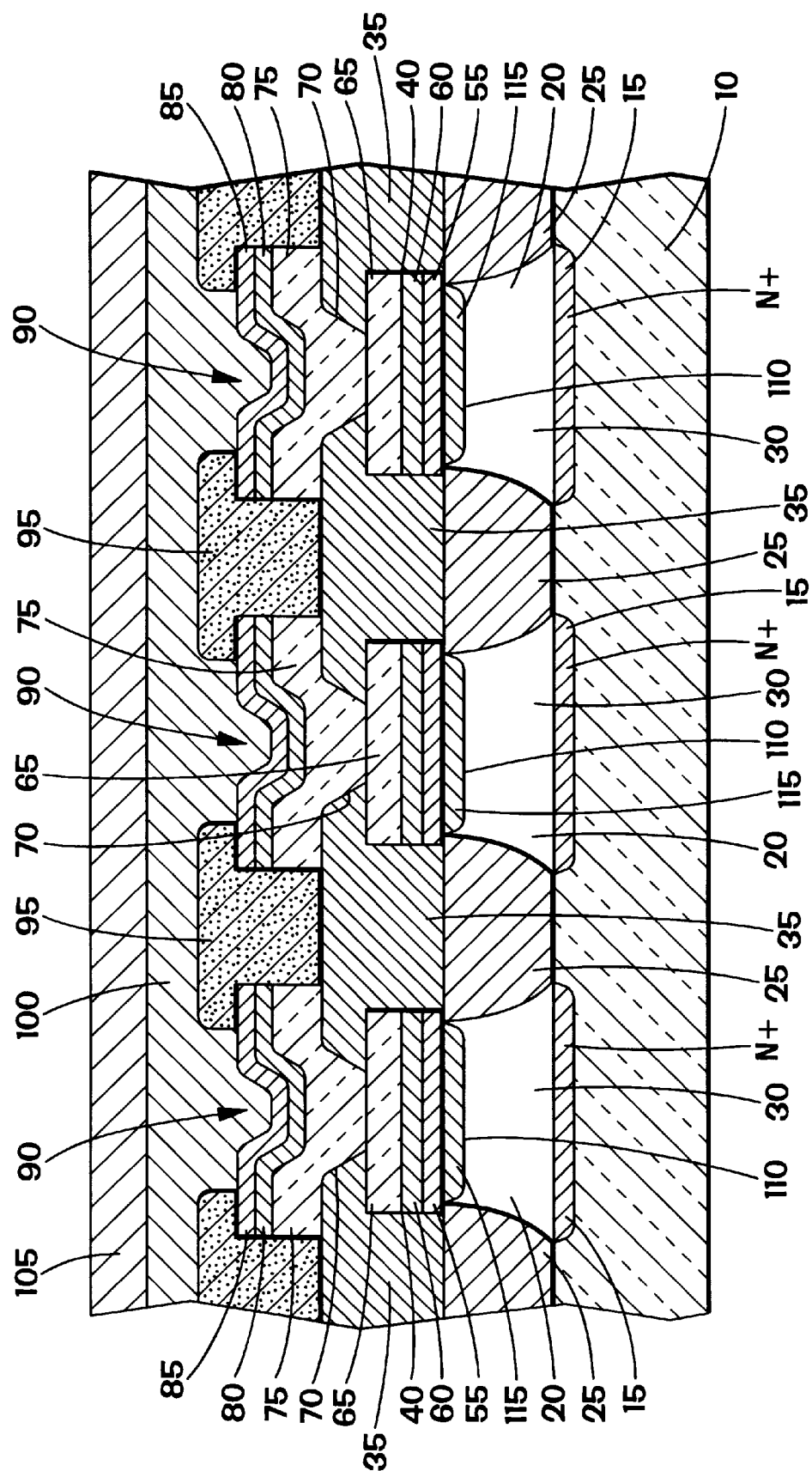
FIG. 3 is a fragmentary cross sectional view illustrating a portion of an integrated circuit electrically erasable and directly overwritable multibit memory configuration of a second preferred embodiment of the present invention.

The embodiment of FIG. 3 is the same as FIG. 2 except that a diode 110 is formed of a Schottky barrier between the n-doped layer 20 and a metal layer 115 which may be, for example, platinum silicide. In other respects, the embodiment of FIG. 3 is formed in the same manner as that of FIG. 2, and like elements are labeled with like numerals.

Figure 4:
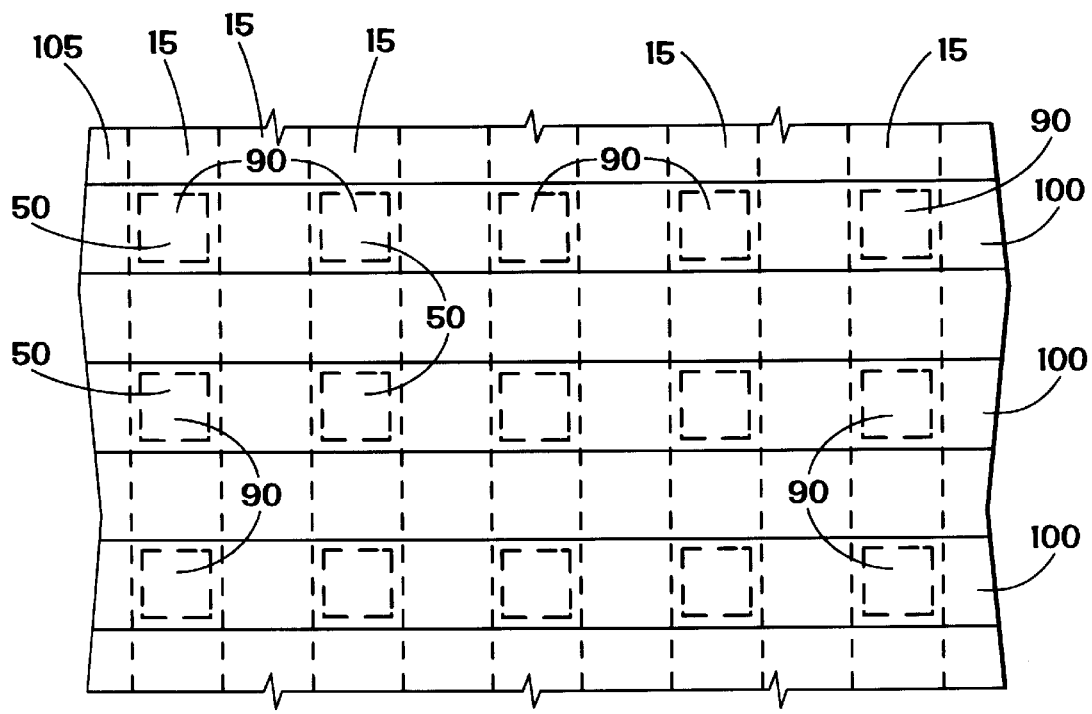
FIG. 4 is a top plan view illustrating a portion of the integrated circuit configurations of FIGS. 2 and 3.

The integrated structure thus formed is an x-y memory matrix connected as shown in FIG. 4 in which each memory cell 90 is connected in series with a diode 50 between a horizontal x-line 100 and a vertical y-line 15. The diodes 50 serve as access devices to electrically isolate each of the memory cells 90. Other types of access devices may also be utilized in accordance with the present preferred embodiment. Other circuit configurations for the electrically erasable memory of the present preferred embodiment are, of course, possible and feasible to implement. One particularly useful configuration is a three dimensional, multilevel array in which a plurality of planes of memory cells 90 and their respective isolation devices are stacked upon one another. Each plane of memory cells 90 is arranged as a plurality of rows and columns of memory cells 90, thereby allowing for X-Y addressing. This stacking of planes, in addition to increasing memory storage density, allows for an additional Z dimension of interconnection. The three-dimensional, thin-film memory array structures of the present preferred embodiment are capable of both conventional serial information processing as well as parallel information processing. Parallel processing and therefore multidimensional memory array structures are required for rapid performance of complex tasks such as pattern recognition, classification or associative learning.

With the integrated structure as shown in the embodiment of FIGS. 2 and 3, however, a completely vertically integrated structure of the memory cells 90 and its isolating diode is formed, thus minimizing the area occupied on the substrate by each of the combinations of memory cells 90 and diodes. This means that the density of the memory cells 90 in the chip is limited essentially only by the resolution of the lithography.

Figure 5:
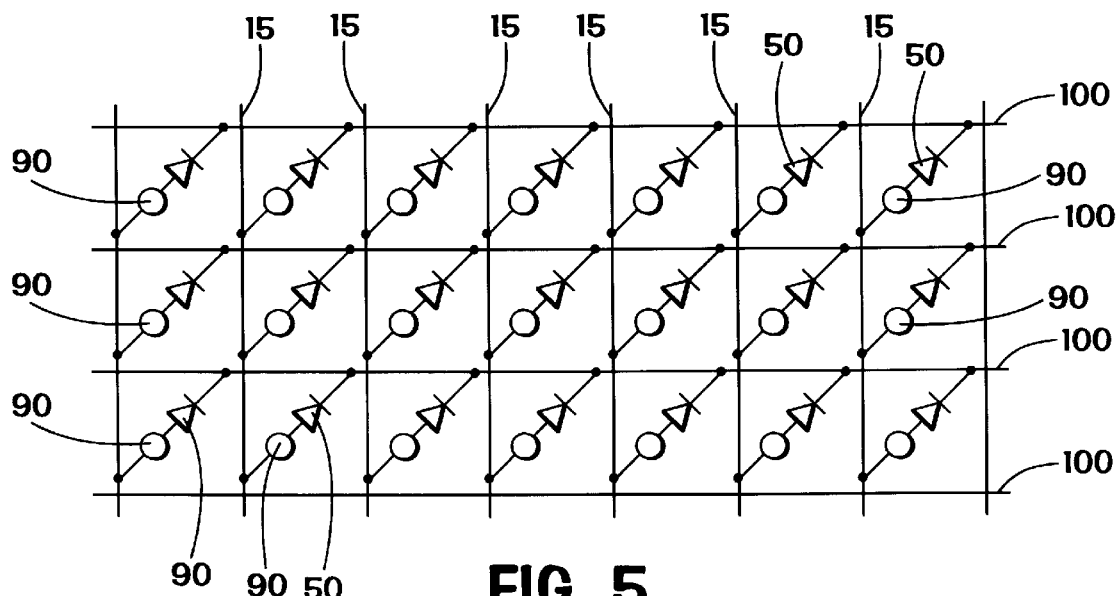
FIG. 5 is a schematic circuit diagram illustrating a portion of the circuitry of the integrated circuit configurations of FIGS. 2 and 3.

FIG. 5 is a circuit diagram of a portion of the embodiments of FIGS. 2–4. The circuit comprises an x-y grid with each of the memory cells 90 being connected in series with a diode 50 at the cross points of the x address lines 100 and the y address lines 15 as shown. The address lines 15 and 100 are connected to external addressing circuitry in a manner well known to those skilled in the art.

In FIG. 6, there is diagrammatically illustrated a portion of a single crystal semiconductor substrate 200 with a memory matrix 210 of the present preferred embodiment formed thereon. Also formed on the same substrate 200 is an addressing matrix 215 which is suitable connected through integrated connections 220 to the memory matrix 210. The addressing matrix 215 includes signal generating means which define and control the setting and read pulses applied to the memory matrix 210. The addressing matrix 215 may be integrated with and formed simultaneously with the memory matrix 210.

The memory of the present preferred embodiment provides for a bit density which is greater than that attainable even in solid state dynamic random access memories (DRAM's), which are volatile and, therefore, lack the further advantages that non-volatility attainable with the present preferred embodiment provides. The increase in bit density attainable with the present preferred embodiment is translated into a corresponding reduction in manufacturing costs because of the smaller areas of the wafer occupied per bit of the integrated circuit configuration. This allows the memory of the present preferred embodiment to compete with and surpass other available memories for a wider range of applications, not only in terms of electrical performance and memory storage capacity but also in terms of cost.

By comparison with prior art semiconductor memories formed of at least one transistor and a capacitor for each bit, the integrated circuit configurations of the present preferred embodiments as shown in FIGS. 2 and 3 can be formed on a chip with greater bit density compared to prior art configurations for the same lithography resolution. In addition to the cost advantages which the higher bit density affords, the performance parameters of the memory in the integrated circuit configuration of the present preferred embodiment are thus even further improved in that the memory cells 90 are positioned closer together and lead lengths, capacitances and other related parameters are further minimized, thereby enhancing performance.

Of course, it is to be appreciated that the reduction in energy requirements correspond, inter alia, to a reduced volume of the memory material. Further reductions in the volume would further reduce the pulse energy required to set a memory cell 90 to a given resistance value. However, the volume requirement must be balanced taking into consideration the realities of modern wafer fabrication processing.

While the invention is susceptible to various modifications and alternative forms, specific embodiments have been shown by way of example in the drawings and will be described in detail herein. However, it should be understood that the invention is not intended to be limited to the particular forms disclosed. Rather, the invention is to cover all modifications, equivalents, and alternatives falling within the spirit and scope of the invention as defined by the appended claims.

What is claimed is:

1. A method of fabricating a chalcogenide memory cell, comprising the acts of:
    providing a first layer of a given chalcogenide material;
    applying a layer of dielectric material onto the first layer of the given chalcogenide material;
    removing a portion of the layer of dielectric material to define an aperture; and
    applying a second layer of the given chalcogenide material onto the dielectric material and into the aperture.

2. The method of claim 1, wherein a cross sectional area of the first layer of the given chalcogenide material and a cross sectional area of the second layer of the given chalcogenide material above the aperture are both greater than a cross sectional area of the aperture.

3. The method of claim 1, where the given chalcogenide material is selected from the group consisting of Se, Te, Ge, Sb and mixtures or alloys thereof.

4. The method of claim 3, wherein the given chalcogenide material includes Te, Ge and Sb in the ratio $Te_aGe_bSb_{100-(a+b)}$ where the subscripts are in atomic percentages which total 100% of the constituent elements and $a<70$ and $15<b<50$.

5. The method of claim 4, wherein $40<a<60$ and $17<b<44$.

6. A method of fabricating a memory cell, comprising the acts of:
    providing a diode assembly including a plurality of vertically aligned material layers; and
    providing a resistive assembly arranged in vertical alignment with the diode assembly, the resistive assembly in electrical communication with the diode assembly, the act of providing a resistive assembly comprising the acts of:
        providing a first layer of a given chalcogenide material;
        applying a layer of a dielectric material onto the first layer of the given chalcogenide material; and
        applying a second layer of the given chalcogenide material onto the layer of the dielectric material;
    wherein the layer of dielectric material is configured to restrict an area of electrical communication between the first and second layers of the given chalcogenide material.

7. The method of claim 6, wherein the act of applying a layer of the dielectric material comprises the act of forming an aperture therein.

8. The method of claim 7, wherein one of the first and second layers of the given chalcogenide material extends through the aperture in the dielectric layer.

9. The memory cell of claim 6, wherein the first chalcogenide layer, the dielectric material layer, and the second chalcogenide layer are each generally horizontally disposed and are each general vertically aligned with the diode assembly.

10. A method of fabricating a memory cell comprising the acts of:
    (a) forming an access device;
    (b) forming a first electrode being electrically coupled to the access device;
    (c) forming a first layer of a given phase-changing material being electrically coupled to the first electrode;
    (d) forming a dielectric layer over the first layer of the given phase-changing material, the dielectric layer having an aperture therein;
    (e) forming a second layer of the given phase-changing material within the aperture and being electrically coupled to the first layer of the given phase-changing material; and
    (f) forming a second electrode being electrically coupled to the second layer of the given phase-changing material.

11. The method, as set forth in claim 10, wherein a cross-sectional area of the second layer of the given phase-changing material within the aperture is less than a cross-sectional area of the first layer of the given phase-changing material.

12. The method, as set forth in claim 10, wherein the given phase-changing material comprises a given chalcogenide material.

13. The method, as set forth in claim 10, wherein the acts (a) through (f) are performed in the order recited.

14. A method of fabricating a memory element of a memory cell comprising the acts of:
    (a) forming a first layer of a given phase-changing material;

(b) forming a dielectric layer over the first layer of the given phase-changing material, the dielectric layer having an aperture therein; and (c) forming a second layer of the given phase-changing material within the aperture and being electrically coupled to the first layer of the given phase-changing material.

15. The method, as set forth in claim 14, wherein a cross-sectional area of the second layer of the given phase-changing material within the aperture is less than a cross-sectional area of the first layer of the given phase-changing material.

16. The method, as set forth in claim 14, wherein the given phase-changing material comprises a given chalcogenide material.

17. The method, as set forth in claim 14, wherein the acts (a) through (c) are performed in the order recited.

18. A method of fabricating a memory cell comprising the acts of:

(a) forming an access device;

(b) forming a first electrode being electrically coupled to the access device;

(c) forming a first layer of a given resistive memory material being electrically coupled to the first electrode;

(d) forming a dielectric layer over the first layer of the given resistive memory material, the dielectric layer having an aperture therein;

(e) forming a second layer of the given resistive memory material within the aperture and being electrically coupled to the first layer of the given resistive memory material; and (f) forming a second electrode being electrically coupled to the second layer of the given resistive memory material.

19. The method, as set forth in claim 18, wherein a cross-sectional area of the second layer of the given resistive memory material within the aperture is less than a cross-sectional area of the first layer of the given resistive memory material.

20. The method, as set forth in claim 18, wherein the given resistive memory material comprises a given chalcogenide material.

21. The method, as set forth in claim 18, wherein the acts (a) through (f) are performed in the order recited.

22. A method of fabricating a memory element of a memory cell comprising the acts of:

(a) forming a first layer of a given resistive memory material;

(b) forming a dielectric layer over the first layer of the given resistive memory material, the dielectric layer having an aperture therein; and (c) forming a second layer of the given resistive memory material within the aperture and being electrically coupled to the first layer of the given resistive memory material.

23. The method, as set forth in claim 22, wherein a cross-sectional area of the second layer of the given resistive memory material within the aperture is less than a cross-sectional area of the first layer of the given resistive memory material.

24. The method, as set forth in claim 22, wherein the given resistive memory material comprises a given chalcogenide material.

25. The method, as set forth in claim 22, wherein the acts (a) through (c) are performed in the order recited.

* * * * *